(12) United States Patent  (10) Patent No.: US 9,176,219 B2
Schmier, II  (45) Date of Patent: Nov. 3, 2015

(54) FREQUENCY FIELD SCANNING (75) Inventor: Mark A. Schmier, II, Mesa, AZ (US)

(73) Assignee: THE BOEING COMPANY, Chicago, IL (US)

(*) Notice: Subject to any disclaimer, the term of this patent is extended or adjusted under 35 U.S.C. 154(b) by 911 days.

(21) Appl. No.: 13/414,474

(22) Filed: Mar. 7, 2012

(65) Prior Publication Data

US 2013/0238279 A1    Sep. 12, 2013

(51) Int. Cl.
G01C 19/00 (2013.01)
G01S 7/41 (2006.01)
G01S 7/40 (2006.01)
G01R 29/08 (2006.01)
G01S 17/66 (2006.01)
G01R 29/10 (2006.01)
G01S 13/86 (2006.01)

(52) U.S. Cl.
CPC ............ G01S 7/411 (2013.01); G01R 29/0821 (2013.01); G01S 7/40 (2013.01); G01R 29/105 (2013.01); G01S 13/865 (2013.01); G01S 17/66 (2013.01)

(58) Field of Classification Search
CPC ..... G01S 13/426; G01S 15/8993; G01S 1/24; G01K 11/006
See application file for complete search history.

(56) References Cited

U.S. PATENT DOCUMENTS

| 4,649,390 | A | * | 3/1987 | Andrews et al. | 342/140 |
| 5,281,972 | A | | 1/1994 | Jain | |
| 5,673,050 | A | | 9/1997 | Moussally et al. | |
| 6,377,204 | B1 | * | 4/2002 | Wurman et al. | 342/59 |
| 2002/0033706 | A1 | | 3/2002 | Khazei | |
| 2006/0220950 | A1 | | 10/2006 | Morgan et al. | |
| 2010/0102277 | A1 | | 4/2010 | Bawendi et al. | |
| 2010/0149038 | A1 | | 6/2010 | Brown et al. | |
| 2011/0084873 | A1 | | 4/2011 | Wei et al. | |
| 2011/0199254 | A1 | * | 8/2011 | Bishop et al. | 342/179 |

FOREIGN PATENT DOCUMENTS

JP    2000206230 A    7/2000

OTHER PUBLICATIONS

Bridges et al., "Laser Trackers: A New Breed of CMM", Quality Digest, Feb. 1998, 6 PAGES, accessed Jan. 31, 2012, http://www.qualitydigest.com/feb98/html/lasertrk.html.
Extended European Search Report, dated Jul. 7, 2014, regarding Application No. EP13154716.8, 9 pages.
Blanchard et al., "The HARC Holographic Imaging Facility-Multistatic Images of Distributed Targets," Earsel Advances in Remote Sensing, vol. 2, No. 1, Jan. 1993, pp. 145-152.
Shields et al., "A New Compact Range Facility for Antenna and Radar Target Measurements," Lincoln Laboratory Journal, vol. 16, No. 2, 2007, pp. 381-391.

* cited by examiner

Primary Examiner — Elias Desta
(74) Attorney, Agent, or Firm — Yee & Associates, P.C.

(57) ABSTRACT

A system and method for scanning a number of frequencies in a test environment. A transmitter and a receiver are moved together to a number of locations in a scanning space. Signals are transmitted at the number of frequencies from the transmitter at the number of locations. Reflected signals are received by the receiver at the number of locations. The reflected signals are reflections of the signals transmitted at the number of frequencies from the transmitter. The number of locations in the scanning space is identified.

19 Claims, 6 Drawing Sheets

FIG. 6

FREQUENCY FIELD SCANNING

BACKGROUND INFORMATION

1. Field

The present disclosure relates generally to field scanning in which signals are transmitted at a number of frequencies in a test environment and signals, reflected in response to the transmitted signals, are received and analyzed. More particularly, the present disclosure relates to determining frequency characteristics of a test environment and supporting, moving, and determining the location of a transmitter and a receiver in a test environment for field scanning to reduce undesired effects on the transmitted and received signals in the test environment.

2. Background

Field scanning involves the transmission of signals at a number of frequencies in a test environment. The test environment may include either an open or enclosed space into which the signals are transmitted. The transmitted signals are reflected from the test environment and objects in the test environment. The reflected signals are received and may be analyzed to determine frequency-related characteristics of the test environment or of objects placed in the test environment.

Signals may be transmitted in the test environment at a number of frequencies. The frequencies of the signals transmitted in the test environment may depend on the particular test or analysis to be performed. For example, without limitation, the signals transmitted in the test environment may include radio frequency signals, radar cross section frequency signals, or signals at any other number of frequencies, ranges of frequencies, or combinations of frequencies.

Field scanning may be used for a number of purposes, objects, or applications. For example, field scanning may be used to identify frequency signatures of various objects. For example, without limitation, field scanning may be used to identify frequency signatures of vehicles, such as aircraft or other vehicles. Further, field scanning may be used to identify frequency responses of air traffic control towers or other airfield structures and operations to identify ambient signals at various frequencies. For example, without limitation, such ambient signals may include emissions from construction crew radios or from various field operation devices, such as aircraft maintenance devices, aircraft radios, nearby cellular telephone towers, amateur and saboteur radio transmissions, or other sources or combinations of sources of potential ambient signals that may affect air traffic control tower and air field operations. Field scanning also may be used to obtain frequency field test data for maritime, ground surveillance, police, mobile radio and telephone, global positioning system, and other electromagnetic products and services.

Field scanning methods and systems may be designed specifically for the test environment and the tests to be performed. Typically, a test environment for field scanning may include a transmitter and receiver, a reflector, an object under test, and a number of support structures. For example, a support structure may be used to support the object under test in the test environment during scanning. A typical structure for supporting the object under test may include a mounting base and pylon or other structures and combinations of structures for supporting the object under test at a desired position in the test environment. The object under test may be mounted to the support structure via a mechanism that provides for rotation or other movement of the test object with respect to the support structure.

The transmitter and receiver typically also may be mounted on a support structure in the test environment. For example, the transmitter and receiver may be mounted at the top of a pylon or other support structure that is positioned at a predetermined location in the test environment. The transmitter and receiver may be attached to the pylon or other support structure via a mechanism that provides for rotation or other movement of the transmitter and receiver with respect to the pylon or other support structure. The transmitter and receiver may be mounted to the support structure facing the reflector.

During the performance of a field scanning test, the transmitter is controlled to emit signals at a number of frequencies in the direction of the reflector. The reflector reflects the transmitted frequencies back to the receiver. The reflected signals are received by the receiver. Frequency data derived from the received reflected signals may be recorded and analyzed.

Various objects in the test environment, including the various structures for supporting the transmitter and receiver in the test environment, may reflect and absorb signals at various frequencies and to various degrees. Therefore, such structures may affect the signals that are transmitted and reflected in the test environment in undesired ways. For example, the presence of such structures and other objects in the test environment may distort the frequency data obtained during a test. This distortion may reduce the accuracy of the frequency data collected and affect the analysis of such data in undesired ways unless such distortion can be corrected. Unless such distortion is identified and removed or accounted for in resulting test data, the actual frequency response of a vehicle or environment undergoing testing in the test environment may be determined less accurately.

The accuracy of frequency response measurements also may be affected by ambient emissions in the test environment where the measurements are made. For example, such ambient emissions may result from terrestrial radio frequency communications in the area where the frequency data is obtained.

Ambient emissions may affect any test or measurement in which a test signal is intentionally transmitted from a transmitter and a resulting test signal received by a receiver is analyzed. In any such test, signals from ambient emissions may be received by the receiver along with reflections of the intentionally transmitted test signal. In this case, the ambient emissions may mask or distort the reflections of the test signal generated by the transmitter. The test signal data derived from the signals received by the receiver may include data resulting from received ambient emissions, thereby affecting the analysis of the test signal data in undesired ways. Therefore, a reliable analysis of the received test signal data may not be made if the test is performed in the presence of ambient emissions.

The effect of ambient emissions on frequency field scanning and other tests involving transmitting and receiving a test signal may be reduced by conducting the tests or other measurements in an area where ambient emissions are known to be at a reduced level. However, conducting such measurements or other tests under such controlled conditions may be expensive, inconvenient, time-consuming, or impractical in many cases.

Accordingly, it would be desirable to have a method and apparatus that takes into account one or more of the issues discussed above, as well as possibly other issues. For example, it would be desirable to have a method and apparatus for identifying a baseline frequency response of a test environment for frequency field scanning. The identified baseline frequency response may take into account the frequency characteristics of ambient objects and signals in the test environment. Baseline frequency response data for the test environment may be used to improve the accuracy of any frequency field scanning tests performed in the test environment.

SUMMARY

An embodiment of the present disclosure provides a method for scanning a number of frequencies in a test environment. A transmitter and a receiver are moved together to a number of locations in a scanning space. Signals are transmitted at the number of frequencies from the transmitter at the number of locations. Reflected signals are received by the receiver at the number of locations. The reflected signals are reflections of the signals transmitted at the number of frequencies from the transmitter. The number of locations in the scanning space is identified.

Another embodiment of the present disclosure provides an apparatus comprising a transmitter, a receiver, and a tracking system. The transmitter is configured to transmit signals at a number of frequencies from a number of locations in a scanning space. The receiver is configured to receive reflected signals at the number of locations in the scanning space. The reflected signals are reflections of the signals transmitted at the number of frequencies by the transmitter. The transmitter and the receiver are configured to be moved together to the number of locations in the scanning space. The tracking system is configured to identify the number of locations in the scanning space.

Another embodiment of the present disclosure provides another method for scanning a number of frequencies in a test environment. A transmitter and a receiver are supported at a location in a scanning space by a number of lines. The number of lines is made of a material that is substantially non-absorbing and substantially non-reflective of signals at a number of frequencies. Signals are transmitted at the number of frequencies from the transmitter at the location. Reflected signals are received by the receiver at the location. The reflected signals are reflections of the signals transmitted at the number of frequencies from the transmitter.

The features, functions, and benefits can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and benefits thereof will best be understood by reference to the following detailed description of illustrative embodiments of the present disclosure when read in conjunction with the accompanying drawings, wherein:

DETAILED DESCRIPTION

The different illustrative embodiments recognize and take into account a number of different considerations. "A number", as used herein with reference to items, means one or more items. For example, "a number of different considerations" means one or more different considerations.

The different illustrative embodiments recognize and take into account that various objects in a test environment may reduce the accuracy of frequency data collected during a field scanning test. For example, structures for supporting a transmitter and receiver in a test environment for field scanning may include objects such as a pylon, rotators or other mechanisms for moving the transmitter and receiver with respect to the pylon, holding fixtures for attaching the transmitter and receiver to the rotators and other mechanisms, or other objects and combinations of objects. All of these objects may reflect or absorb signals at various frequencies to various degrees. Therefore, such objects may affect the signals transmitted in the test environment such that the reflected signals received by the receiver are changed in undesired ways. These undesired effects on the signals received during a field scanning test may reduce the accuracy of the frequency data derived from the received signals.

The different illustrative embodiments recognize and take into account that the data acquired from a scanning test may be manually adjusted to try to remove or reduce errors and ambiguities in the data that may result from the undesired signal distortions caused by the various support structures and other objects in the scanning space during the test. However, such manual adjustment of the acquired data may itself create errors or ambiguities in the data and reduce the accuracy of the data. For example, the effect that the various structures and other objects in the test environment may have on the resulting test data may not be clearly known. Therefore, the appropriate adjustment of the data to compensate for the effects of these structures and other objects in the scanning space may not be known. Furthermore, it is not clear in many cases whether the manual adjustment of the data acquired during a field scanning test to compensate for the effects of support structures and other objects in the scanning space actually improves the test data set or injects further errors or ambiguities into the data.

The different illustrative embodiments also recognize and take into account that ambient signals in a test environment also may affect the accuracy of frequency field scanning tests performed in the test environment in undesired ways. The different illustrative embodiments recognize and take into account that the current solution for reducing the effect of ambient emissions on frequency field scanning and other tests involving transmitting and receiving of test signals is to conduct the tests in a location or under conditions in which ambient emissions are reduced. However, it may be expensive to establish a test environment that is free from all ambient noise and structures. Therefore, the number of these "quiet" test environments are limited and the demand to use these test environments may be high. It may be difficult to get a favorable schedule slot to use these test environments.

Furthermore, these test environments typically may be established at locations where ambient radio emissions are known to be reduced. Typically, such locations may be relatively remote. Conducting a frequency field scanning or other test in such a test environment may entail relocating the object under test, along with the required test equipment and personnel, to a remote location. Therefore, conducting tests in such test environments established at remote locations may be relatively expensive. For example, if the object under test is an aircraft, costs associated with conducting a frequency field scanning test at a remote location may include fuel for moving the aircraft to the remote location and back, costs associated with local facility support at the remote location, as well as food, transport, and hotel expenses for the flight crew, the ground crew, and the engineering crew.

The different illustrative embodiments also recognize and take into account that if any substantial errors are discovered in the test data obtained by field scanning it may not be possible to repeat the test. Furthermore, many errors in the test data resulting from the presence of ambient signals and support structures and other objects in the scanning space may not be discoverable from the test data itself. In this case, such errors may only be identified when a production prototype is tested. Fixes at that late stage of development may be much more expensive than fixes that might have been made at an earlier stage of development if accurate test data was obtained from the scanning test.

The different illustrative embodiments also recognize and take into account that current systems for supporting a transmitter and receiver in a field scanning test environment may provide for limited movement of the transmitter and receiver in the scanning space. For example, current structures for supporting a transmitter and receiver in the scanning space may include mechanisms for rotating the transmitter and receiver with respect to the pylon or other structure on which the transmitter and receiver are mounted. As another example, current structures for supporting a transmitter and receiver in a scanning space may include mechanisms for moving the transmitter and receiver back and forth over a limited distance along one direction with respect to the pylon or other structure on which the transmitter and receiver are mounted. For example, such a mechanism may be configured to move the transmitter and receiver up and down or side to side with respect to the pylon or other structure on which the transmitter and receiver are mounted. However, as the transmitter and receiver, along with a rotator mechanism, if any, are moved further in any direction from the center of the support pylon or other structure the entire support system becomes more unbalanced. Therefore, the movement of the transmitter and receiver from the center of the support pylon or other support structure in any direction may be limited in current systems to prevent the entire structure from falling over.

Thus, one or more of the illustrative embodiments provides a system and method for improved field scanning in a test environment. One or more of the illustrative embodiments provides a system and method for identifying a baseline frequency response of a test environment including the effects of ambient signals and objects in the test environment. The baseline frequency response of the test environment may be removed from test data obtained during frequency field scanning of a test object in the test environment to remove the effect of the ambient test environment on the test data. Furthermore, or more of the illustrative embodiments provides a system and method for supporting and moving a transmitter and receiver in a test environment for field scanning in a manner that reduces undesired signal distortions and that improves the movability of the transmitter and receiver within the scanning space.

In accordance with an illustrative embodiment, a transmitter and receiver may be moved together to a number of locations in the scanning space. Signals are transmitted at a number of frequencies by the transmitter at the number of locations and reflected signals are received by the receiver at the number of locations. The reflected signals may include reflections of the transmitted signals from ambient objects in the scanning space. Ambient signals in the scanning space also may be received by the receiver. The locations in the scanning space at which signals are transmitted and ambient and reflected signal are received may be accurately identified. Frequency data derived from the signals received by the receiver may be matched with the locations in the scanning space at which the signals are received to identify accurately frequency characteristics of the scanning space, including frequency characteristics of ambient signals and objects in the scanning space.

The frequency characteristics of the scanning space determined in this manner may be used to improve the results of tests performed in a test environment. The frequency characteristics of the scanning space may be used to adjust the test data obtained during a field scanning test performed in the test environment to obtain more accurate test results. For example, the frequency characteristics of the scanning space may be removed from test data obtained during frequency field scanning of a test object in the scanning space to remove the effect of the ambient scanning space on the test data, leaving only test data of interest. In another example, the frequency characteristics of the scanning space may be used to select a position of a test object or other structure in the scanning space to improve the accuracy of field scanning tests performed on the test object.

Illustrative embodiments therefore allow accurate frequency field scanning tests to be performed in test environments where many ambient objects and signals may be present. For example, illustrative embodiments allow for test environments to be established at locations such as, without limitation, airports, military bases, factories, or other locations where many ambient objects and signals may be present. In accordance with an illustrative embodiment, the effect of such ambient objects and signals may be removed from test data obtained during frequency field scanning in the test environment. Therefore, illustrative embodiments allow for accurate frequency field scanning tests to be performed at more accessible locations. Illustrative embodiments therefore provide for more convenient and less expensive frequency field scanning tests. The expenses associated with establishing remote test environments that are free of ambient structures and signals, and the expenses and inconvenience associated with conducting frequency field scanning tests at such remote locations, may be avoided.

In accordance with an illustrative embodiment, a transmitter and receiver may be supported by a number of lines in the scanning space. The lines may be made of a material that is non-reflective and non-absorbing for frequencies of interest. The lines may be connected to motors, such as servo-motors, that may be positioned at the edge of the scanning space.

During the performance of a field scanning test, the motors may be controlled to move the transmitter and receiver on the lines to a number of locations in the scanning space. The transmitter may transmit signals at a number of frequencies of interest at the number of locations in the scanning space. The transmitted signals are reflected in the scanning space and the reflected signals are received by the receiver. The locations of the transmitter and receiver in the scanning space at which the signals are transmitted and received may be identified using a tracking system. For example, an optical tracking system may be used to identify the number of locations of the transmitter and receiver in the scanning space by optically identifying the location of a tracking marker that is moved along with the transmitter and receiver in the scanning space. Other components of the tracking system may be positioned at the edge of the scanning space.

Frequency information derived from the reflected signals received by the receiver may be provided as frequency data via an appropriate data link to a processor unit. Location data from the tracking system for identifying the number of locations of the transmitter and receiver in the scanning space also may be provided to the processor unit. The processor unit may be configured to match the received frequency data with the received location data to identify frequency data corresponding to the number of locations in the scanning space. The frequency data corresponding to the number of locations may be stored and analyzed. For example, without limitation, the frequency data may be analyzed to identify frequency characteristics of the scanning space. As another example, the frequency data may be analyzed to identify frequency characteristics of a test object in the test space. In this case, the analysis may include removing frequency characteristics of the scanning space obtained by frequency field scanning of the scanning space without the test object from the frequency data obtained by frequency field scanning of the test object in the test environment.

In accordance with an illustrative embodiment, objects in a test environment associated with supporting, moving, and identifying the location of a transmitter and receiver in a scanning space are reduced and made of appropriate materials so that the effects of such structures on the frequency data obtained by frequency field scanning is reduced or eliminated. For example, in accordance with an illustrative embodiment, the transmitter and receiver may be supported and moved in the scanning space on lines that are made of materials that are non-reflective and non-absorbing of signals at frequencies of interest that are transmitted and reflected in the scanning space during frequency field scanning. Furthermore, in accordance with an illustrative embodiment, other structures for supporting, moving, and determining the location of the transmitter and receiver in the scanning space may be positioned at the edge of the scanning space or at other locations in the scanning space where the effects of such structures on the signals transmitted and reflected in the scanning space is reduced or eliminated.

Furthermore, one or more of the illustrative embodiments provides a system and method in which a transmitter and receiver may be moved more easily in a plurality of directions to a plurality of locations that may extend across a scanning space. In one illustrative example, the transmitter and receiver may be moved in any direction to any location in a plane that extends entirely across a scanning space in one or more directions.

Figure 1:
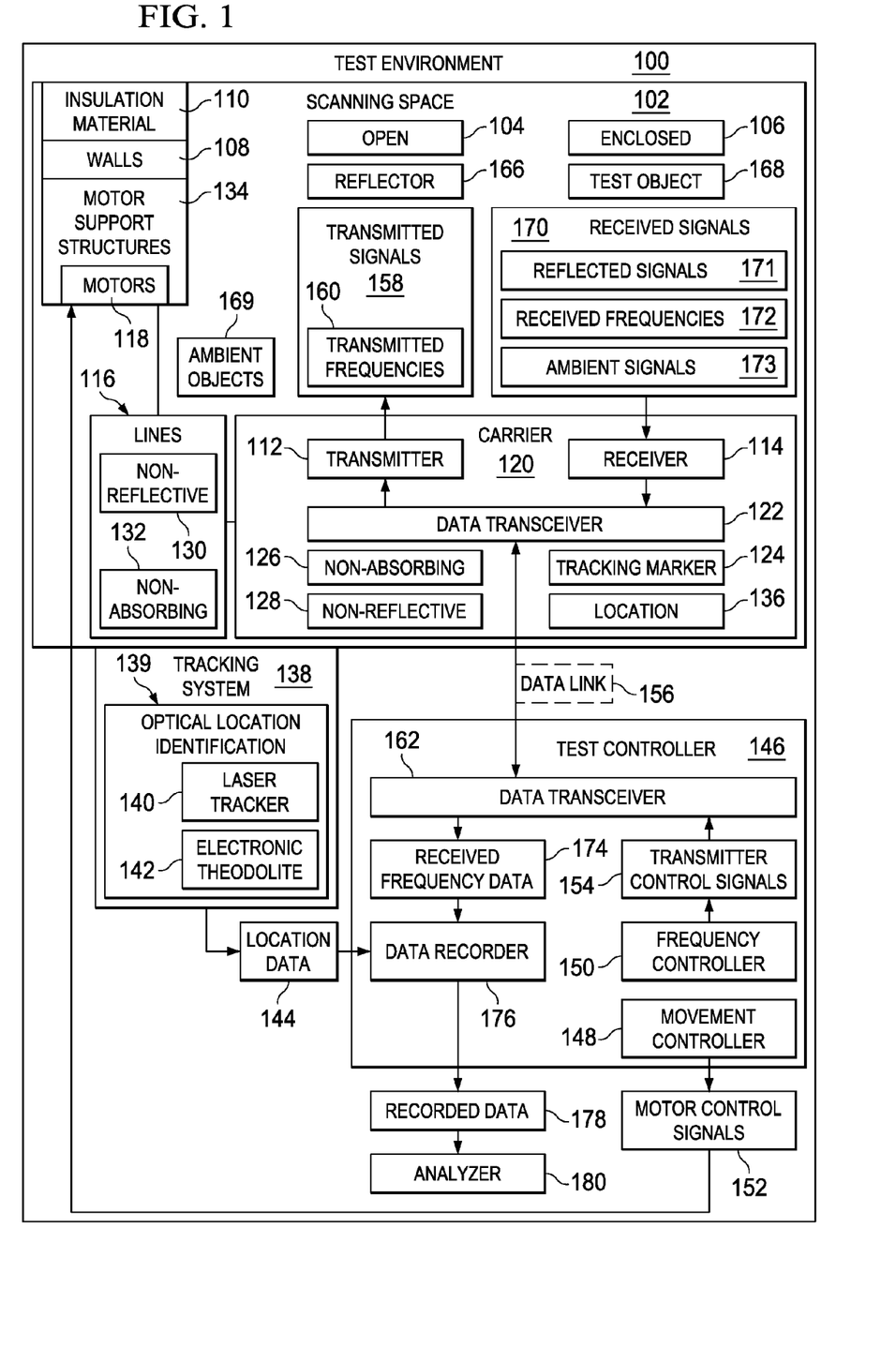
FIG. 1 is an illustration of a block diagram of a test environment in accordance with an illustrative embodiment.

Turning now to FIG. 1, an illustration of a block diagram of a test environment is depicted in accordance with an illustrative embodiment. Test environment 100 includes scanning space 102. Scanning space 102 is the space in which signals may be transmitted and received at a number of frequencies of interest to perform frequency field scanning. Scanning space 102 may be a three-dimensional space of any size or shape.

Scanning space 102 may be open 104 or enclosed 106. Scanning space 102 that is open 104 may not have well-defined boundaries that separate scanning space 102 from other spaces that are not part of scanning space 102. For example, without limitation, scanning space 102 that is open 104 may be an outdoor space or another space that is open 104 but that may be within a larger space that is enclosed. Scanning space 102 that is enclosed 106 may include various structures for physically separating scanning space 102 from other spaces. For example, without limitation, scanning space 102 that is enclosed 106 may be surrounded by one or more walls 108 or other structures for physically separating scanning space 102 from other spaces. In this example, walls 108 may include a ceiling, a floor, and other similar structures for enclosing a space. In another example, scanning space 102 may be partially open or partially enclosed.

Walls 108 may be made of any appropriate material and structural design for enclosing scanning space 102. Walls 108 or portions of walls 108 may be covered with insulation material 110. Alternatively or additionally, walls 108 or portions of walls 108 may be made of insulation material 110. Insulation material 110 may be any material or combination of materials that prevents or reduces signals at frequencies of interest from reflecting off of walls 108. Insulation material 110 may be shaped and positioned on walls 108 in known ways to prevent or reduce the reflection of signals at frequencies of interest from walls 108. For purposes of the present application, "frequencies of interest" refers to frequencies of signals that are or may be transmitted, reflected, or received in scanning space 102 during field scanning performed in test environment 100. Therefore, the use of insulation material 110 on walls 108 may reduce or eliminate undesired effects on frequency data collected during frequency field scanning due to signal reflections from walls 108 of scanning space 102.

Transmitter 112 and receiver 114 are located in scanning space 102. In accordance with an illustrative embodiment, transmitter 112 and receiver 114 are supported and moved in scanning space 102 on lines 116. Lines 116 are connected to motors 118. As will be described in more detail below, motors 118 may be controlled to move transmitter 112 and receiver 114 in any direction to a number of locations in scanning space 102 by moving lines 116.

Transmitter 112 and receiver 114 may be implemented as separate devices or as a single transceiver device. Transmitter 112 may be implemented as any transmitter device configured to transmit signals at a number of frequencies of interest. Similarly, receiver 114 may be implemented as any device configured to receive signals at the number of frequencies of interest. For example, without limitation, transmitter 112 and receiver 114 may be configured to transmit and receive radio frequency signals, radar cross section frequency signals, or signals at any other number of frequencies, ranges of frequencies, or combinations of frequencies.

Transmitter 112 and receiver 114 may be attached to carrier 120. Carrier 120 may be any structure for carrying transmitter 112 and receiver 114 so that transmitter 112 and receiver 114 and any other components attached to carrier 120 may be moved together in scanning space 102. In accordance with an illustrative embodiment, the size and shape of carrier 120 may be selected to minimize or eliminate the effect of carrier 120 on signals at frequencies of interest in scanning space 102. For example, without limitation, the size and shape of carrier 120 may be selected so that carrier 120 is only large enough to carry transmitter 112, receiver 114, data transceiver 122, and tracking marker 124, as well as to provide a sufficient structure for attaching lines 116 to carrier 120.

Furthermore, carrier 120 may be made of a material or a combination of materials that is non-absorbing 126 and non-reflective 128 for signals at frequencies of interest. For example, without limitation, carrier 120 may be made of nylon, Teflon, or another material or combination of materials that is non-absorbing 126 and non-reflective 128. Making carrier 120 of a material that is non-absorbing 126 and non-reflective 128 further reduces or eliminates the potential effects of carrier 120 on signals at frequencies of interest in scanning space 102.

Lines 116 may be substantially flexible, elongated structures. For example, without limitation, lines 116 may include cables, ropes, cords, strings, or other similar flexible elongated structures or combinations of such structures. As another example, lines 116 may be rigid or semi-rigid elongated structures. For example, without limitation, lines 116 may be elongated rods, poles, bars, or other similar rigid or semi-rigid elongated structures or combinations of such structures.

Lines 116 may be made using any appropriate manufacturing process. In accordance with an illustrative embodiment, lines 116 may be made of a material or a combination of materials that is substantially non-reflective 130 and non-absorbing 132 for signals at frequencies of interest in scanning space 102. For example, without limitation, lines 116 may be made of a material such as nylon, Teflon, or other materials or combinations of materials that are substantially non-reflective 130 and non-absorbing 132 for signals at frequencies of interest in scanning space 102. Lines 116 made of materials that are non-reflective 130 and non-absorbing 132 do not affect signals at frequencies of interest in scanning space 102 in undesired ways. Therefore, use of lines 116 made of materials that are non-reflective 130 and non-absorbing 132 reduces the possibility of undesired distortion of frequency data collected in test environment 100.

The cross-sectional size of lines 116 is the size of lines 116 in any direction perpendicular to the direction along the elongated length of lines 116. The cross-sectional size of lines 116 may be minimized, taking into account considerations such as, for example, without limitation, the strength of the materials and the structure of which lines 116 are made, the number and arrangement of lines 116 attached to carrier 120, the weight of carrier 120 and the components attached to carrier 120, or possibly other considerations or combinations of considerations. Minimizing the cross-sectional size of lines 116 further reduces the possibility that lines 116 may affect signals at frequencies of interest in scanning space 102 in undesired ways.

A number of lines in lines 116 may be attached at first ends of lines 116 to carrier 120. The first ends of lines 116 may be attached to carrier 120 in any appropriate manner using any appropriate attachment device or structure. Lines 116 may be attached to carrier 120 at any appropriate locations on carrier 120 for moving carrier 120 in scanning space 102 in a desired manner by moving lines 116.

Lines 116, attached at the first ends of lines 116 to carrier 120, may be connected at the second, opposite ends of lines 116 to motors 118. For example, without limitation, each of lines 116 attached to carrier 120 may be connected to one or more of motors 118. Therefore, a number of lines in lines 116 may extend between motors 118 and carrier 120. For example, without limitation, lines 116 may be connected to motors 118 via spools, pulleys, or other structures or combinations of structures such that lines 116 may be moved by operating motors 118. For example, without limitation, motors 118 may be electric stepper motors, servo-motors, or other motors that may be controlled to move lines 116 connected to motors 118. Moving lines 116 attached to carrier 120 by motors 118 moves carrier 120 to change the location of carrier 120, and thus the location of the components mounted on carrier 120, in scanning space 102.

Motors 118 may be located outside of scanning space 102 or at locations in scanning space 102 where the effects of motors 118 on signals at frequencies of interest in scanning space 102 is reduced or eliminated. For example, motors 118 may be located at the edge of scanning space 102. In one example, motors 118 may be attached to or mounted in walls 108. Locating motors 118 outside of or at the edge of scanning space 102 reduces the possibility that motors 118 will affect signals at frequencies of interest in scanning space 102 in undesired ways.

Motors 118 may be covered or partially covered by insulation material 110. In this case, motors 118 and insulation material 110 may be positioned so that insulation material 110 covering or partially covering motors 118 does not interfere with movement of lines 116 by motors 118. Covering or partially covering motors 118 by insulation material 110 further reduces the possibility that motors 118 will affect signals at frequencies of interest in scanning space 102 in undesired ways.

Motors 118 may be supported in the desired positions in or near scanning space 102 by motor support structures 134. Motor support structures 134 may include any structure or combination of structures for supporting motors 118 that is appropriate for test environment 100 in which motors 118 are used to move carrier 120. For example, in the case where scanning space 102 is enclosed 106, motor support structures 134 may include walls 108 of scanning space 102. Any appropriate device or structure may be used to attach motors 118 to walls 108 or to mount motors 118 in walls 108 in this example. In another example, where scanning space 102 is open 104, motor support structures 134 may include self-standing structures for supporting motors 118 at desired locations in or near scanning space 102.

Any number of lines 116 and motors 118 may be used in any configuration for supporting and moving carrier 120 in scanning space 102. In some configurations, a number of lines 116 may be connected between individual motors 118 or groups of motors 118, and another number of lines 116 may be connected between motors 118 and carrier 120 to provide a configuration for moving carrier 120 in a number of directions to a number of locations in scanning space 102.

For example, without limitation, lines 116 and motors 118 may be configured such that motors 118 may be controlled to move carrier 120 on lines 116 in any direction to any location in a two-dimensional plane in scanning space 102. Such a two-dimensional plane may extend entirely or partially across scanning space 102 in a number of directions. In another example, motors 118 and lines 116 may be configured such that motors 118 may be controlled to move carrier 120 on lines 116 in any direction to any location in a three-dimensional space within scanning space 102. Such a three-dimensional space may extend entirely or partially across scanning space 102 in a number of directions.

In accordance with an illustrative embodiment, location 136 of carrier 120 in scanning space 102 at any point in time may be identified by tracking system 138. Preferably, tracking system 138 uses optical location identification 139 to identify location 136 of carrier 120 in scanning space 102. For purposes of the present application, "optical location identification" refers to any method for identifying the location of an object using wavelengths of light, including wavelengths of light that may not be visible to the human eye. For example, without limitation, tracking system 138 may include laser tracker 140, electronic theodolite 142, or another device or combination of devices or systems that may use optical location identification 139 to identify location 136 of carrier 120 in scanning space 102.

Laser tracker 140 may operate by sending a laser beam from laser tracker 140 to tracking marker 124 on carrier 120. Tracking marker 124 may be an appropriate structure or mark attached to or otherwise formed on carrier 120 or attached to or otherwise formed on any component attached to carrier 120. Tracking marker 124 may consist of an identifiable part of carrier 120 or of any component attached to carrier 120. Characteristics of tracking marker 124 for any particular application may depend upon the requirements of tracking system 138 used in that application. For example, without limitation, where tracking system 138 is laser tracker 140, tracking marker 124 may be configured as a retro-reflective target for the laser beam sent from laser tracker 140. In this example, without limitation, tracking marker 124 may be implemented as a spherical retro-reflective target attached to carrier 120.

The laser beam sent by laser tracker 140 is reflected off of tracking marker 124 and retraces its path, re-entering laser tracker 140. A portion of the reflected laser light that re-enters laser tracker 140 goes to an interferometer that measures the distance from laser tracker 140 to tracking marker 124 on carrier 120. Laser tracker 140 also may include two angular encoders. These devices measure the angular orientation of two mechanical axes of laser tracker 140. Measuring the angles provided by the encoders and the distance provided by the interferometer is sufficient to precisely locate tracking marker 124, and therefore carrier 120, in three-dimensional space with respect to laser tracker 140. With laser tracker 140 positioned in a known location with respect to scanning space 102, location 136 of carrier 120 in scanning space 102 may be identified in a conventional manner from the location of carrier 120 with respect to laser tracker 140.

Electronic theodolite 142 may determine location 136 of carrier 120 in scanning space 102 in a manner similar to laser tracker 140 but without sending a laser beam or other signal to carrier 120. For example, electronic theodolite 142 may be equipped with electro-optical devices for passively detecting tracking marker 124 on carrier 120. Electronic theodolite 142 may also include electro-optical distance measuring devices. Therefore, electronic theodolite 142 may be configured for identifying a complete three-dimensional vector defining the location of tracking marker 124, and therefor carrier 120, with respect to electronic theodolite 142. With electronic theodolite 142 positioned at a known location with respect to scanning space 102, location 136 of carrier 120 in scanning space 102 may be identified in a known manner from the identified location of carrier 120 with respect to electronic theodolite 142.

In any case, tracking system 138 may provide location data 144 that indicates location 136 of carrier 120 in scanning space 102 at any point in time. Location data 144 may indicate location 136 of carrier 120 as coordinates in any desired three-dimensional coordinate system for scanning space 102. For example, location data 144 may indicate location 136 of carrier 120 in scanning space 102 as three X, Y, Z coordinates in a three-dimensional orthogonal coordinate system or any other coordinate system. In this example, the origin of the three-dimensional orthogonal coordinate system or any other coordinate system may be located anywhere inside or outside of scanning space 102. In another illustrative embodiment, tracking system 138 may provide location data 144 identifying location 136 of carrier 120 in scanning space 102 as coordinates in another coordinate system. The coordinates in another coordinate system then may be converted in a known manner to coordinates in a desired coordinate system for scanning space 102.

The components of tracking system 138, except for tracking marker 124, may be located outside of scanning space 102 or at a position in scanning space 102 where signals at frequencies of interest in scanning space 102 are not affected by the components of tracking system 138. For example, the components of tracking system 138, except for tracking marker 124, may be positioned at or near an edge of scanning space 102, such as at or near one of walls 108 at or near the floor of scanning space 102. Positioning the components of tracking system 138 outside of or at the edge of scanning space 102 may reduce or eliminate undesired effects on signals at frequencies of interest in scanning space 102.

The components of tracking system 138 may be positioned in scanning space 102 such that tracking system 138 faces a side of carrier 120 that is opposite another side of carrier 120 to which transmitter 112 and receiver 114 are attached. In this example, tracking marker 124 may be attached to or otherwise formed on the side of carrier 120 opposite the side thereof to which transmitter 112 and receiver 114 are attached. Positioning the components of tracking system 138 with respect to each other and scanning space 102 in the manner described may further reduce or eliminate undesired effects on signals at frequencies of interest in scanning space 102.

In accordance with an illustrative embodiment, operation and movement of transmitter 112 and receiver 114 may be controlled by test controller 146. For example, test controller 146 may be configured to direct movement of transmitter 112 and receiver 114 to a number of locations in scanning space 102 and to control operation of transmitter 112 and receiver 114 to perform frequency field scanning in test environment 100. The functions performed by test controller 146 may be implemented in hardware or hardware operating in combination with software. For example, without limitation, test controller 146 may be implemented in an appropriately configured computer or other data processing device or system.

Test controller 146 may include movement controller 148. Movement controller 148 may be configured to direct movement of carrier 120, and thus movement of transmitter 112 and receiver 114, to a number of locations in scanning space 102. For example, movement controller 148 may be configured to generate motor control signals 152 for controlling operation of motors 118. Motor control signals 152 may be configured to operate motors 118 in a coordinated manner to move lines 116 in the desired manner to move carrier 120 in any direction to a number of locations in scanning space 102. Any appropriate connections, drivers, or other structures, devices, or combinations of structures and devices may be used to provide motor control signals 152 from movement controller 148 to motors 118 to operate motors 118 in the desired manner.

Test controller 146 also may include frequency controller 150. Frequency controller 150 may be configured to control the number of frequencies transmitted by transmitter 112 at a number of locations in scanning space 102. For example, frequency controller 150 may be configured to generate transmitter control signals 154 for controlling the number of frequencies transmitted by transmitter 112.

Transmitter control signals 154 may be provided from test controller 146 to transmitter 112 via data link 156. For example, without limitation, data link 156 may be a wireless or other data link formed at one end by data transceiver 122 on carrier 120 and at the other end by data transceiver 162 associated with test controller 146. Data transceiver 162 may be implemented as part of test controller 146 or using a separate device or system connected to or accessible by test controller 146. Any appropriate devices or systems or combination of devices or systems may be used to implement data link 156. Data link 156 may be operated to provide information exchange between test controller 146 and transmitter 112 and receiver 114 on carrier 120 using any appropriate transmission media, transmission frequencies, and protocols for providing data communications.

Data link 156 may be operated so that operation of data link 156 does not affect signals at frequencies of interest in scanning space 102 in an undesired way. For example, transmission frequencies used for operation of data link 156 may be selected so that operation of data link 156 does not affect signals at frequencies of interest in scanning space 102 in an undesired way. In another example, data link 156 may be operated only at times when transmitter 112 and receiver 114 are not operated to transmit and receive signals at frequencies of interest in scanning space 102.

Transmitter control signals 154 may be configured to control transmitter 112 to generate transmitted signals 158 at transmitted frequencies 160 when transmitter 112 is at a number of locations in scanning space 102. Transmitted signals 158 may be reflected from and absorbed by scanning space 102 and various objects in scanning space 102. For example, without limitation, transmitted signals 158 may be reflected from reflector 166 located in scanning space 102. In another example, transmitted signals 158 may be reflected or absorbed by test object 168 located in scanning space 102. Furthermore, transmitted signals 158 may be reflected or absorbed by ambient objects 169 in scanning space 102.

Received signals 170 comprise signals in scanning space 102 that are received by receiver 114. Received signals 170 may include reflected signals 171 and ambient signals 173. Reflected signals 171 may include transmitted signals 158 that are reflected from reflector 166, test object 168, ambient objects 169, or other objects or combinations of objects in scanning space 102. Ambient signals 173 may include signals in scanning space 102 that originate from a source other than transmitter 112. Ambient signals 173 may originate from inside scanning space 102, outside of scanning space 102, or both. In this example, received signals 170 that result from signal reflections from ambient objects 169 or from ambient signals 173 may be undesirable. Received signals 170 may be received by receiver 114 at received frequencies 172. In this example, transmitted frequencies 160 and received frequencies 172 that result from received reflections of transmitted signals 158 are examples of frequencies of interest.

Received frequency data 174 may be data derived from received signals 170 received at received frequencies 172 by receiver 114. Received frequency data 174 may be provided from receiver 114 to test controller 146 via data link 156. Received frequency data 174 received by test controller 146 may be recorded by data recorder 176. For example, received frequency data 174 may be recorded by data recorder 176 as recorded data 178 in a database or other data structure in a data storage device that is part of or accessible by test controller 146.

Location data 144 from tracking system 138 also may be recorded by data recorder 176. Therefore, recorded data 178 may include both received frequency data 174 and location data 144. Location data 144 may be provided from tracking system 138 to test controller 146 for recording by data recorder 176 using any appropriate data link and method of data communications. As discussed above, location data 144 identifies location 136 of transmitter 112 and receiver 114 in scanning space 102 at any point in time. Specifically, location data 144 may identify the number of locations in scanning space 102 at which received signals 170 are received by receiver 114.

Frequency data corresponding to a number of locations in scanning space 102 may be identified from recorded data 178 by matching received frequency data 174 with location data 144 identifying location 136 in scanning space 102 at which corresponding received frequency data 174 was obtained by receiver 114. For example, without limitation, received frequency data 174 may be time stamped to indicate the time corresponding received signals 170 are received by receiver 114, and location data 144 may be time stamped to indicate the time location 136 of receiver 114 is identified by tracking system 138. In this case, received frequency data 174 may be matched to location data 144 by matching time stamps in received frequency data 174 with time stamps in location data 144. Alternatively, received frequency data 174 may be sent to test controller 146 as corresponding received signals 170 are received by receiver 114, and location data 144 may be sent to test controller 146 as location 136 of receiver 114 is identified by tracking system 138. In this case, received frequency data 174 may be matched to location data 144 by matching received frequency data 174 with location data 144 that is received by test controller 146 at substantially the same time.

Recorded data 178 may be analyzed by analyzer 180. Analyzer 180 may be part of test controller 146. Alternatively, analyzer 180 may be implemented in a data processing device or system that is separate from test controller 146 and configured to receive or otherwise obtain recorded data 178 as provided by test controller 146. Analyzer 180 may analyze recorded data 178 in any useful or desired manner. For example, without limitation, analyzer 180 may analyze recorded data 178 to identify frequency characteristics of scanning space 102 for baseline characterization of test environment 100. As another example, analyzer 180 may analyze recorded data 178 obtained during frequency field scanning in test environment 100 for determining frequency characteristics of test object 168. In this case, the identified frequency characteristics of scanning space 102 may be used to adjust the data obtained during the frequency field scanning test to obtain more accurate test results. As another example, baseline characterization of test environment 100 may be conducted to determine where test object 168, reflector 166, transmitter 112, receiver 114, or any other object or combination of objects are to be positioned in scanning space 102 for conducting a frequency field scanning test in test environment 100.

The illustration of FIG. 1 is not meant to imply physical or architectural limitations to the manner in which different illustrative embodiments may be implemented. Other components in addition to, in place of, or both in addition to and in place of the ones illustrated may be used. Some components may be unnecessary in some illustrative embodiments. Also, the blocks are presented to illustrate some functional components. One or more of these blocks may be combined or divided into different blocks when implemented in different illustrative embodiments.

For example, data link 156 may comprise two or more data links configured for communication of data between carrier 120 and test controller 146. As one example, a first data link may be configured for providing transmitter control signals 154 from test controller 146 to transmitter 112 and a different second data link may be configured for providing received frequency data 174 from receiver 114 to data recorder 176. As another example, an appropriate storage device may be provided on carrier 120 for storing transmitter control signals 154 on carrier 120 before transmitter control signals 154 are provided to transmitter 112, for storing received frequency data 174 on carrier 120 before received frequency data 174 is transmitted to test controller 146, or both. In this example, the appropriate storage device may be part of another device attached to carrier 120 or may be a separate storage device attached to carrier 120.

Figure 2:
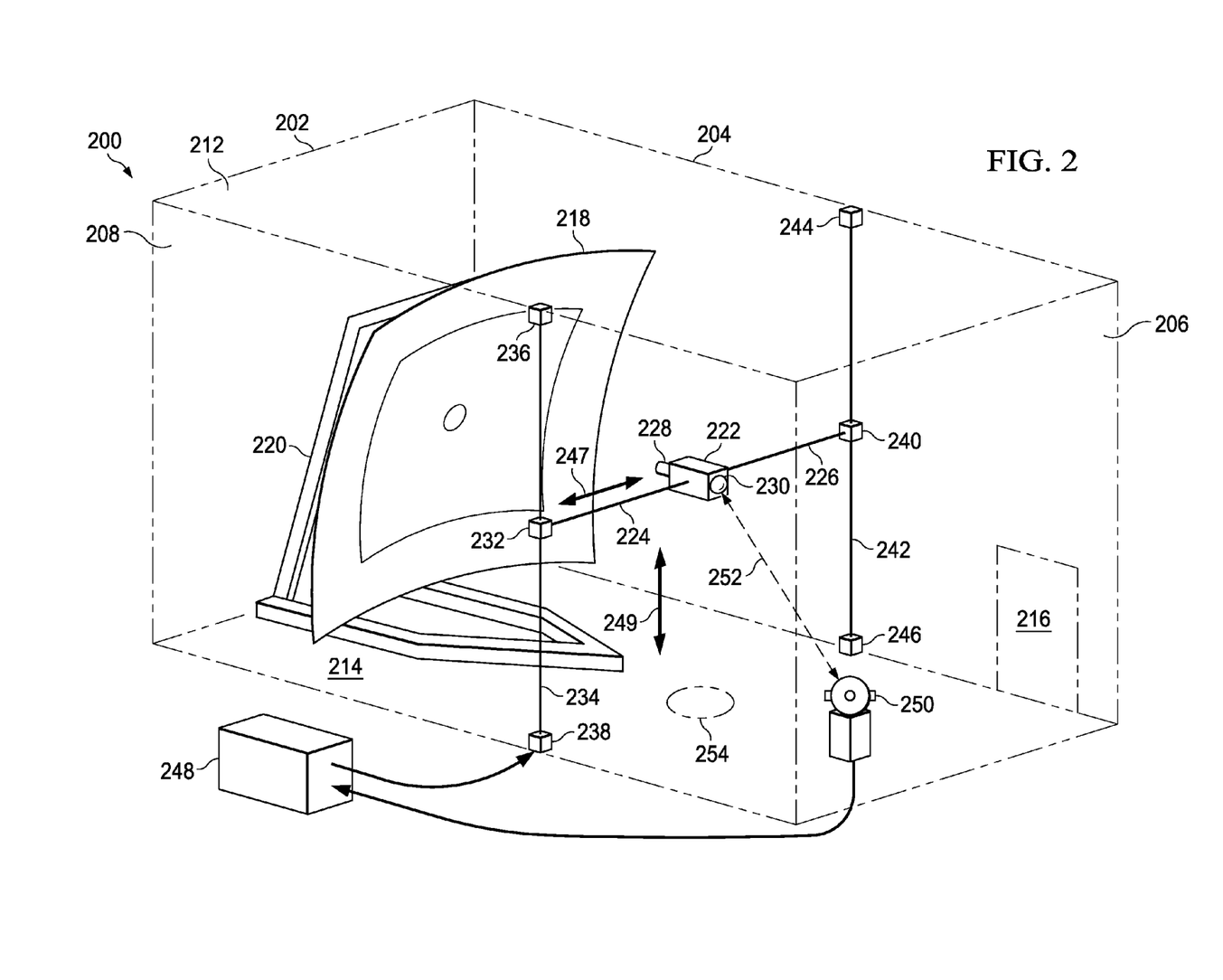
FIG. 2 is an illustration of a scanning space configured for frequency field scanning in accordance with an illustrative embodiment.

Turning now to FIG. 2, an illustration of a scanning space configured for frequency field scanning is depicted in accordance with an illustrative embodiment. In this example, scanning space 200 is an example of one implementation of scanning space 102 in FIG. 1. Scanning space 200 is an example of an enclosed scanning space. Scanning space 200 is enclosed by walls 202, 204, 206, and 208, ceiling 212, and floor 214. All or portions of walls 202, 204, 206, and 208, ceiling 212, and floor 214 may be covered with or made of appropriate insulation material, not shown in FIG. 2, to reduce or eliminate the reflection of signals of interest in scanning space 200 from walls 202, 204, 206, and 208, ceiling 212, and floor 214. Door 216 may be provided in wall 204 to provide access to the interior of scanning space 200.

Reflector 218 is positioned in scanning space 200. In this example, reflector 218 is attached to support structure 220. Support structure 220 supports reflector 218 in an elevated position above floor 214 in scanning space 200.

Carrier 222 is supported in scanning space 200 by lines 224 and 226. Transmitter and receiver 228 and tracking marker 230 are attached to carrier 222. Line 224 extends from carrier 222 to motor 232. Motor 232 may be located at the edge of scanning space 200 on or near wall 208. Motor 232 is connected by lines 234 to motors 236 and 238. Motors 236 and 238 also may be located on the edge of scanning space 200. In this example, motor 236 is located on or near wall 208 where wall 208 meets ceiling 212. Motor 238 is located on or near wall 208 where wall 208 meets floor 214. Line 226 extends from carrier 222 to motor 240. Motor 240 may be located at the edge of scanning space 200 on or near wall 204. Motor 240 is connected by lines 242 to motors 244 and 246. Motors 244 and 246 also may be located on the edge of scanning space 200. In this example, motor 244 is located on or near wall 204 where wall 204 meets ceiling 212. Motor 246 is located on or near wall 204 where wall 204 meets floor 214.

Thus, motors 232, 236, 238, 240, 244, and 246 are positioned at locations in scanning space 200 such that the effect of motors 232, 236, 238, 240, 244, and 246 on signals at frequencies of interest in scanning space 200 is reduced or eliminated. Carrier 222 and lines 224, 226, 234, and 242 may be made of materials that are non-absorbing and non-reflective for signals at frequencies of interest in scanning space 200. Thus, the effect of carrier 222 and lines 224, 226, 234, and 242 on signals at frequencies of interest in scanning space 200 also is reduced or eliminated.

Movement of carrier 222 in scanning space 200 may be controlled by test controller 248. For example, test controller 248 may control movement of carrier 222 in scanning space 200 by providing appropriate motor control signals 245 for controlling operation of motors 232, 236, 238, 240, 244, and 246 to move lines 224, 226, 234, and 242 in a coordinated manner to move carrier 222 to a number of locations in scanning space 200. For clarity of illustration, motor control signals 245 are only shown as being provided from test controller 248 to motor 238 in FIG. 2. However, motor control signals 245 may be provided in any appropriate manner from motor controller 248 to all of motors 232, 236, 238, 240, 244, and 246.

In this example, motors 232 and 240 may be controlled to move carrier 222 in the directions indicated by arrows 247 by moving lines 224 and 226. Motors 236 and 238 may be controlled to move motor 232 in the directions indicated by arrows 249 by moving lines 234. Motors 244 and 246 may be controlled to move motor 240 in the directions indicated by arrows 249 by moving lines 242. Therefore, in this example, motors 232, 236, 238, 240, 244, and 246 may be controlled to move carrier 222 in any direction to any location in a plane that extends substantially from ceiling 212 to floor 214 of scanning space 200 and across scanning space 200 from wall 204 to wall 208 at the locations of lines 234 and 242.

Tracking system 250 may be configured to identify the location of carrier 222 in scanning space 200 at any point in time. For example, as described above, tracking system 250 may employ optical location identification for identifying the location of carrier 222 in scanning space 200. Thus, tracking system 250 may be positioned at a location in scanning space 200 that is in line of sight 252 with tracking marker 230 on carrier 222 at whatever location carrier 222 is moved to in scanning space 200. In this example, tracking system 250 is located at an edge of scanning space 200 on floor 214 near wall 206. Thus, tracking system 250 is positioned at a location in scanning space 200 such that the effect of tracking system 250 on signals at frequencies of interest in scanning space 200 is reduced or eliminated. Location information identifying the location of carrier 222 in scanning space 200 may be provided via any appropriate connection 253 from tracking system 250 to test controller 248.

Test controller 248 may control transmitter and receiver 228 to transmit signals at a number of frequencies of interest from the number of locations in scanning space 200. For example, without limitation, transmitter and receiver 228 may be configured and controlled to transmit signals at the number of frequencies of interest from the number of locations in the direction of reflector 218. Reflected signals may be received by transmitter and receiver 228 at the number of locations in scanning space 200. The reflected signals received by transmitter and receiver 228 are reflections of the signals transmitted at the number of frequencies in scanning space 200 by transmitter and receiver 228. For example, the reflected signals received by transmitter and receiver 228 may include transmitted signals that are reflected by reflector 218. Received frequency data derived from the reflected signals received by transmitter and receiver 228 may be provided from transmitter and receiver 228 back to test controller 248. Control signals from test controller 248 for controlling operation of transmitter and receiver 228 and received frequency data from transmitter and receiver 228 may be communicated between test controller 248 and transmitter and receiver 228 via any appropriate wireless data link, not shown in FIG. 2.

In accordance with an illustrative embodiment, test controller 248 may control scanning in scanning space 200 to identify frequency characteristics of scanning space 200. The frequency characteristics of scanning space 200 may be used to select appropriate locations to position various objects in scanning space 200 for performing frequency field scanning tests in scanning space 200. For example, identified frequency characteristics of scanning space 200 may be used to select an appropriate location in scanning space 200 for positioning a support structure for supporting a test object in scanning space 200. In this example, it may be determined that location 254 on floor 214 is an appropriate location for positioning a support structure for supporting a test object in scanning space 200 for performing a frequency field scanning test on the test object in scanning space 200.

Figure 3:
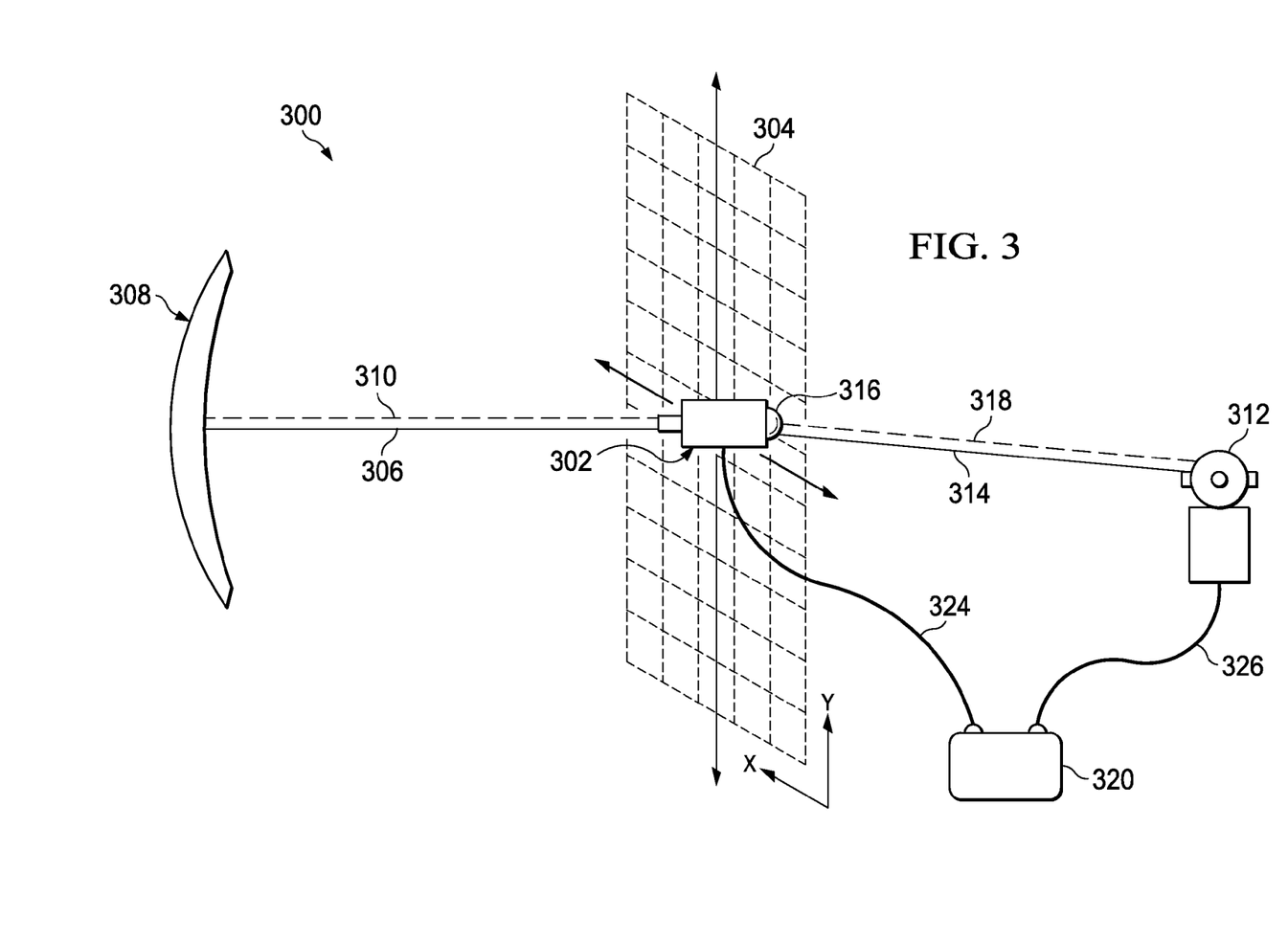
FIG. 3 is an illustration of frequency field scanning for baseline characterization of a test environment in accordance with an illustrative embodiment.

Turning now to FIG. 3, an illustration of frequency field scanning for baseline characterization of a test environment is depicted in accordance with an illustrative embodiment. In this example, test environment 300 is an example of one implementation of test environment 100 in FIG. 1. Baseline characterization of test environment 300 may be conducted, for example, to identify frequency characteristics of test environment 300. These frequency characteristics may be used to adjust test data obtained during a frequency field scanning test performed in test environment 300 to improve the accuracy of the frequency field scanning test. As another example, baseline characterization of test environment 300 may be used to determine where a test object, reflector, transmitter and receiver, or any other object or combination of objects are to be positioned in test environment 300 for conducting a frequency field scanning test in test environment 300.

In this example, transmitter and receiver 302 are moved in any direction to a number of locations in plane 304 in test environment 300. For example, transmitter and receiver 302 may be moved on a number of lines in any direction to the number of locations in plane 304. Transmitted signals 306, indicated by a solid line, are transmitted by transmitter and receiver 302 at a number of frequencies in the direction of reflector 308 in test environment 300 from the number of locations in test environment 300. Reflected signals 310, indicated by a dashed line, are reflections of transmitted signals 306 that are reflected by reflector 308. Reflected signals 310 at a number of frequencies may be received by transmitter and receiver 302 at the number of locations in test environment 300. Received frequency data may be derived from reflected signals 310 received by transmitter and receiver 302 at the number of locations in test environment 300.

The location of transmitter and receiver 302 in plane 304 may be determined by tracking system 312. In this example, tracking system 312 may be a laser tracker that directs laser beam 314, indicated by a solid line, at tracking marker 316 associated with transmitter and receiver 302. For example, tracking marker 316 may be attached to carrier 317 along with transmitter and receiver 302 so that tracking marker 316 is moved along with transmitter and receiver 302 as transmitter and receiver 302 are moved to a number of locations in test environment 300. Reflected laser beam 318, shown as a dashed line, is returned from tracking marker 316 to tracking system 312. Tracking system 312 uses reflected laser beam 318 to determine the location of transmitter and receiver 302 in plane 304 at any point in time.

Frequency data for a number of locations in test environment 300 may be provided from transmitter and receiver 302 to test controller 320 via data link 324. For example, without limitation, data link 324 may be a wireless data link. Control signals for controlling the operation of transmitter and receiver 302 also may be provided from test controller 320 to transmitter and receiver 302 via data link 324. Location data may be provided to test controller 320 from tracking system 312 via link 326. The location data provided to test controller 320 indicates the locations of transmitter and receiver 302 in test environment 300 at which corresponding frequency data is obtained. Test controller 320 may store the received frequency data and location data. Matched frequency data and corresponding location data stored by test controller 320 may be analyzed in any appropriate manner to identify the frequency characteristics of test environment 300.

Figure 4:
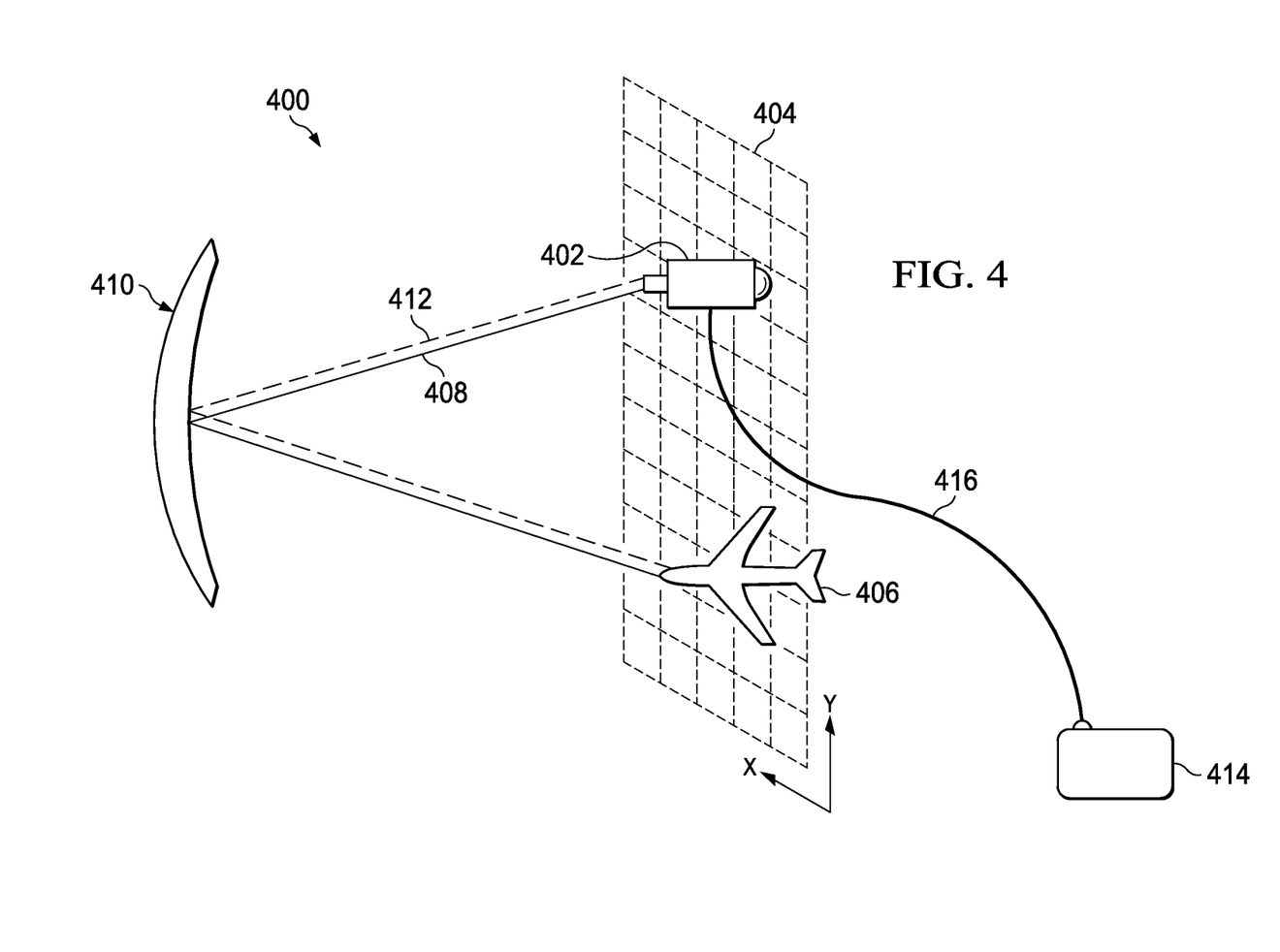
FIG. 4 is an illustration of frequency field scanning for a test object in accordance with an illustrative embodiment.

Turning now to FIG. 4, an illustration of frequency field scanning for a test object is depicted in accordance with an illustrative embodiment. In this example, test environment 400 is an example of one implementation of test environment 100 in FIG. 1. Frequency field scanning for a test object may be used to determine frequency characteristics of test object 406.

In this example, transmitter and receiver 402 and test object 406 are positioned at locations in plane 404 in test environment 400. The locations of transmitter and receiver 402 and test object 406 in test environment 400 may be selected using frequency characteristics of test environment 400 identified in the manner described above. For example, transmitter and receiver 402 may be supported at the desired position in plane 404 on a number of lines. In this example, test object 406 is depicted as an object with the shape of an aircraft. However, test object 406 may be any other object having any shape, size, and characteristics.

Transmitted signal 408, indicated by a solid line, is transmitted from transmitter and receiver 402 at a number of frequencies in the direction of reflector 410 in test environment 400. Transmitted signal 408 may be reflected from reflector 410 onto test object 406.

Reflected signal 412, indicated by a dashed line, is reflected from test object 406 and returned to transmitter and receiver 402 via reflector 410. Reflected signal 412 may be received by transmitter and receiver 402. Frequency data may be derived from reflected signal 412 received by transmitter and receiver 402. The frequency data may be provided to test controller 414 via data link 416. For example, without limitation, data link 416 may be a wireless data link between transmitter and receiver 402 and test controller 414. Control signals for controlling operation of transmitter and receiver 402 also may be provided to transmitter and receiver 402 via data link 416.

Frequency data received by test controller 414 may be stored by test controller 414 for use in identifying frequency characteristics of test object 406. The frequency data received and stored by test controller 414 may be adjusted using frequency data identifying frequency characteristics of test environment 400 to improve the accuracy of the identified frequency characteristics of test object 406. Frequency data identifying frequency characteristics of test environment 400 may be obtained in the manner described above. The frequency data identifying frequency characteristics of test environment 400 may be obtained before frequency data is obtained in test environment 400 for test object 406, after frequency data is obtained in test environment 400 for test object 406, or both.

Figure 5:
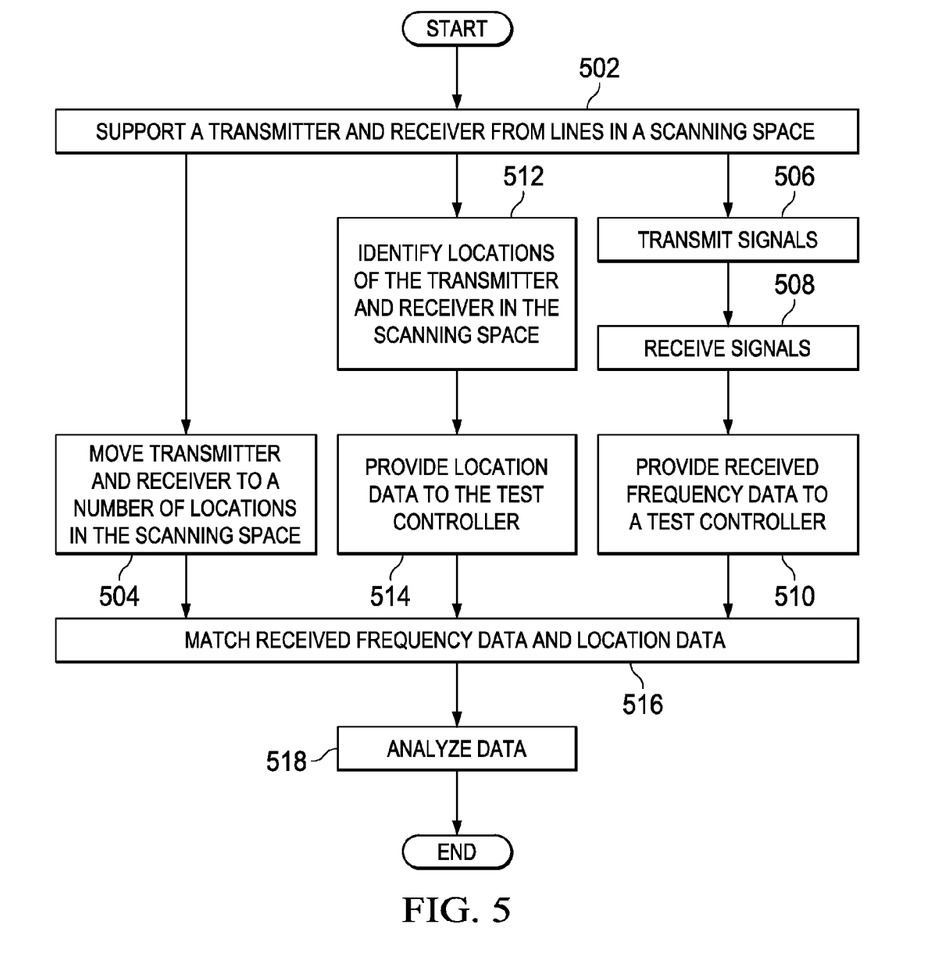
FIG. 5 is an illustration of a flowchart of a process for frequency field scanning in accordance with an illustrative embodiment.

Turning now to FIG. 5, an illustration of a flowchart of a process for frequency field scanning is depicted in accordance with an illustrative embodiment. The process illustrated in FIG. 5 may be performed, for example, in test environment 100 in FIG. 1.

The process begins by supporting a transmitter and receiver in a scanning space (operation 502). For example, the transmitter and receiver may be supported from a number of lines in the scanning space. The lines may be made of a material that is non-reflective and non-absorbing for frequencies of interest in the scanning space.

The transmitter and receiver are moved to a number of locations in the scanning space (operation 504). For example, the transmitter and receiver may be moved to the number of locations in the scanning space by moving the lines supporting the transmitter and receiver in the scanning space.

At the number of locations in the scanning space, signals are transmitted by the transmitter (operation 506), reflected signals are received by the receiver (operation 508), and received frequency data is provided to a test controller (operation 510). The signals transmitted by the transmitter may include signals transmitted in the scanning space at a number of frequencies of interest. The reflected signals are reflections of the signals transmitted at the frequencies of interest in the scanning space. The received frequency data is derived from the reflected signal data received by the receiver.

As operations 506, 508, and 510 are performed at the number of locations in the scanning space, the locations of the transmitter and receiver in the scanning space are identified (operation 512), and the identified locations of the transmitter and receiver are provided as location data to the test controller (operation 514). Received frequency data and location data may then be matched (operation 516) so that frequency data for corresponding locations in the scanning space may be identified. This matched data then may be analyzed (operation 518), with the process terminating thereafter. For example, without limitation, operation 518 may include analyzing frequency data for baseline characterization of a test environment or for identifying frequency characteristics of a test object. Operation 518 also may include using frequency data identifying frequency characteristics of the test environment to adjust frequency data used for identifying frequency characteristics of a test object to more accurately identify the frequency characteristics of the test object.

Figure 6:
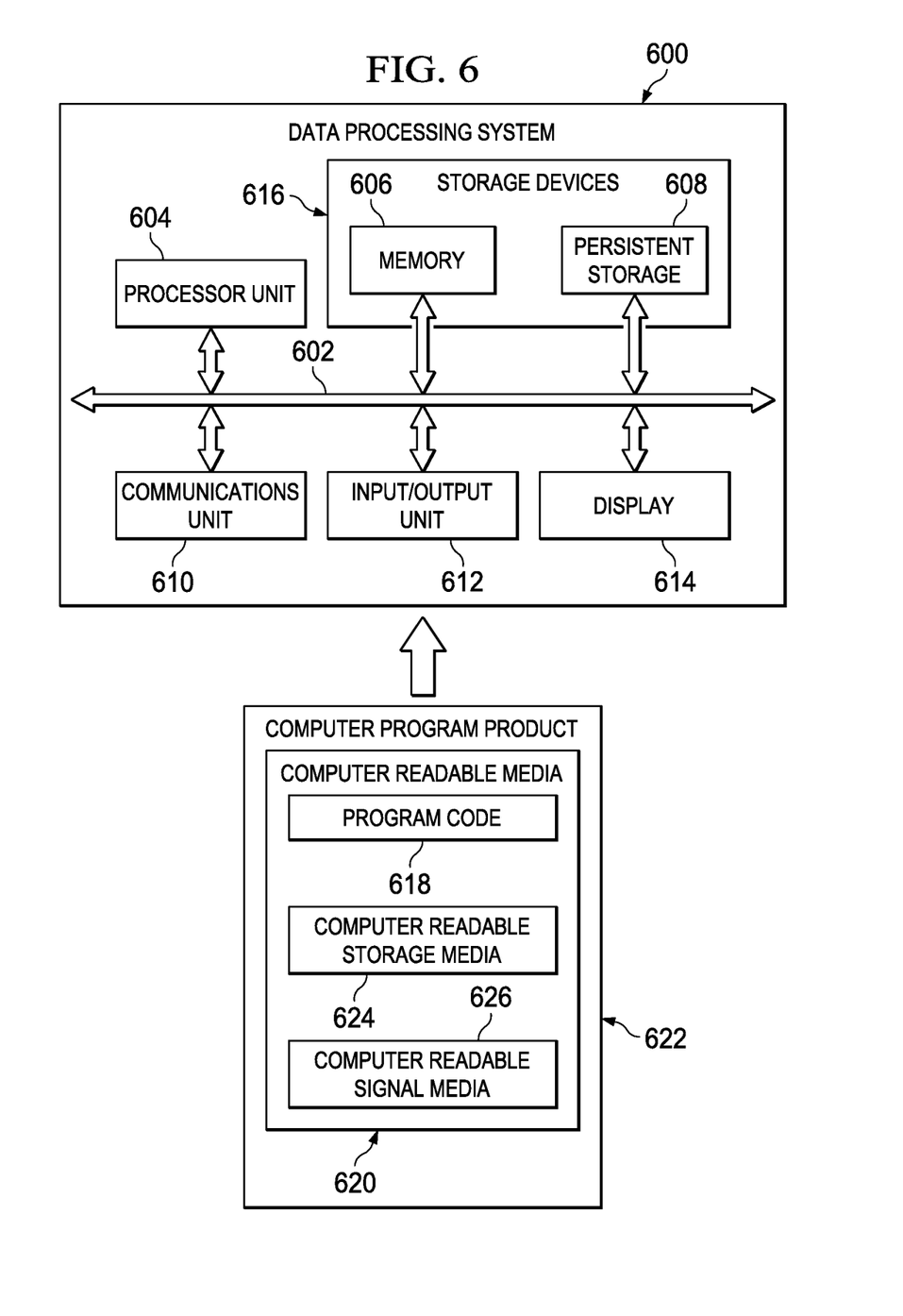
FIG. 6 is an illustration of a data processing system in accordance with an illustrative embodiment.

Turning now to FIG. 6, an illustration of a data processing system is depicted in accordance with an illustrative embodiment. In this example, data processing system 600 is an example of one implementation of a data processing device for implementing test controller 146 or analyzer 180 in FIG. 1. For example, without limitation, data processing system 600 may be a general purpose or special purpose data processing system that is configured to perform a number of functions of test controller 146 in FIG. 1, that is configured to perform a number of functions of analyzer 180 in FIG. 1, or both. For example, without limitation, data processing system 600 may be a general purpose or special purpose data processing system that is configured to perform the functions of movement controller 148 in FIG. 1, that is configured to perform the functions of frequency controller 150 in FIG. 1, that is configured to perform the functions of data recorder 176 in FIG. 1, or that is configured to perform other functions or combinations of functions in accordance with the illustrative embodiments disclosed herein.

In this illustrative example, data processing system 600 includes communications fabric 602. Communications fabric 602 provides communications between processor unit 604, memory 606, persistent storage 608, communications unit 610, input/output (I/O) unit 612, and display 614. Memory 606, persistent storage 608, communications unit 610, input/output (I/O) unit 612, and display 614 are examples of resources accessible by processor unit 604 via communications fabric 602.

Processor unit 604 serves to run instructions for software that may be loaded into memory 606. Processor unit 604 may be a number of processors, a multi-processor core, or some other type of processor, depending on the particular implementation.

Further, processor unit 604 may be implemented using a number of heterogeneous processor systems in which a main processor is present with secondary processors on a single chip. As another illustrative example, processor unit 604 may be a symmetric multi-processor system containing multiple processors of the same type.

Memory 606 and persistent storage 608 are examples of storage devices 616. A storage device is any piece of hardware that is capable of storing information, such as, for example, without limitation, data, program code in functional form, and/or other suitable information either on a temporary basis and/or a permanent basis. Storage devices 616 may also be referred to as computer readable storage devices in these examples. Memory 606, in these examples, may be, for example, a random access memory or any other suitable volatile or non-volatile storage device. Persistent storage 608 may take various forms, depending on the particular implementation.

For example, persistent storage 608 may contain one or more components or devices. For example, persistent storage 608 may be a hard drive, a flash memory, a rewritable optical disk, a rewritable magnetic tape, or some combination of the above. The media used by persistent storage 608 also may be removable. For example, a removable hard drive may be used for persistent storage 608.

Communications unit 610, in these examples, provides for communications with other data processing systems or devices. In these examples, communications unit 610 is a network interface card. Communications unit 610 may provide communications through the use of either or both physical and wireless communications links.

Input/output unit 612 allows for input and output of data with other devices that may be connected to data processing system 600. For example, input/output unit 612 may provide a connection for user input through a keyboard, a mouse, and/or some other suitable input device. Further, input/output unit 612 may send output to a printer. Display 614 provides a mechanism to display information to a user.

Instructions for the operating system, applications, and/or programs may be located in storage devices 616, which are in communication with processor unit 604 through communications fabric 602. In these illustrative examples, the instructions are in a functional form on persistent storage 608. These instructions may be loaded into memory 606 for execution by processor unit 604. The processes of the different embodiments may be performed by processor unit 604 using computer-implemented instructions, which may be located in a memory, such as memory 606.

These instructions are referred to as program instructions, program code, computer usable program code, or computer readable program code that may be read and executed by a processor in processor unit 604. The program code in the different embodiments may be embodied on different physical or computer readable storage media, such as memory 606 or persistent storage 608.

Program code 618 is located in a functional form on computer readable media 620 that is selectively removable and may be loaded onto or transferred to data processing system 600 for execution by processor unit 604. Program code 618 and computer readable media 620 form computer program product 622 in these examples. In one example, computer readable media 620 may be computer readable storage media 624 or computer readable signal media 626.

Computer readable storage media 624 may include, for example, an optical or magnetic disk that is inserted or placed into a drive or other device that is part of persistent storage 608 for transfer onto a storage device, such as a hard drive, that is part of persistent storage 608. Computer readable storage media 624 also may take the form of a persistent storage, such as a hard drive, a thumb drive, or a flash memory, that is connected to data processing system 600. In some instances, computer readable storage media 624 may not be removable from data processing system 600.

In these examples, computer readable storage media 624 is a physical or tangible storage device used to store program code 618 rather than a medium that propagates or transmits program code 618. Computer readable storage media 624 is also referred to as a computer readable tangible storage device or a computer readable physical storage device. In other words, computer readable storage media 624 is a media that can be touched by a person.

Alternatively, program code 618 may be transferred to data processing system 600 using computer readable signal media 626. Computer readable signal media 626 may be, for example, a propagated data signal containing program code 618. For example, computer readable signal media 626 may be an electromagnetic signal, an optical signal, or any other suitable type of signal. These signals may be transmitted over communications links, such as wireless communications links, optical fiber cable, coaxial cable, a wire, or any other suitable type of communications link. In other words, the communications link or the connection may be physical or wireless in the illustrative examples.

In some illustrative embodiments, program code 618 may be downloaded over a network to persistent storage 608 from another device or data processing system through computer readable signal media 626 for use within data processing system 600. For instance, program code stored in a computer readable storage medium in a server data processing system may be downloaded over a network from the server to data processing system 600. The data processing system providing program code 618 may be a server computer, a client computer, or some other device capable of storing and transmitting program code 618.

The different components illustrated for data processing system 600 are not meant to provide architectural limitations to the manner in which different embodiments may be implemented. The different illustrative embodiments may be implemented in a data processing system including components in addition to, in place of, or both in addition to and in place of those illustrated for data processing system 600.

Other components shown in FIG. 6 can be varied from the illustrative examples shown. The different embodiments may be implemented using any hardware device or system capable of running program code. As one example, data processing system 600 may include organic components integrated with inorganic components and/or may be comprised entirely of organic components excluding a human being. For example, a storage device may be comprised of an organic semiconductor.

In another illustrative example, processor unit 604 or other components or combinations of components of data processing system 600 may take the form of a hardware unit that has circuits that are manufactured or configured for a particular use. This type of hardware may perform operations without needing program code to be loaded into a memory from a storage device to be configured to perform the operations. For example, without limitation, a number of such hardware units may be configured to perform a number of functions of test controller 146 in FIG. 1. For example, without limitation, a number of such hardware units may be configured to perform the functions of movement controller 148 in FIG. 1, of frequency controller 150 in FIG. 1, of data recorder 176 in FIG. 1, or of other functions or combinations of functions of the illustrative embodiments disclosed herein.

For example, when processor unit 604 takes the form of a hardware unit, processor unit 604 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations.

Examples of programmable logic devices include, for example, a programmable logic array, a programmable array logic, a field programmable logic array, a field programmable gate array, and other suitable hardware devices. With this type of implementation, program code 618 may be omitted, because the processes for the different embodiments are implemented in a hardware unit.

In still another illustrative example, processor unit 604 may be implemented using a combination of processors found in computers and hardware units. Processor unit 604 may have a number of hardware units and a number of processors that are configured to run program code 618. With this depicted example, some of the processes may be implemented in the number of hardware units, while other processes may be implemented in the number of processors.

In another example, a bus system may be used to implement communications fabric 602 and may be comprised of one or more buses, such as a system bus or an input/output bus. Of course, the bus system may be implemented using any suitable type of architecture that provides for a transfer of data between different components or devices attached to the bus system.

Additionally, communications unit 610 may include a number of devices that transmit data, receive data, or transmit and receive data. Communications unit 610 may be, for example, a modem or a network adapter, two network adapters, or some combination thereof.

Further, a memory may be, for example, memory 606, or a cache, such as found in an interface and memory controller hub that may be present in communications fabric 602.

The flowchart and block diagrams described herein illustrate the architecture, functionality, and operation of possible implementations of systems, methods, and computer program products according to various illustrative embodiments. In this regard, each block in the flowchart or block diagrams may represent a module, segment, or portion of code, which comprises one or more executable instructions for implementing the specified logical function or functions. It should also be noted that, in some alternative implementations, the functions noted in a block may occur out of the order noted in the figures. For example, the functions of two blocks shown in succession may, in fact, be executed substantially concurrently, or the functions of the blocks may sometimes be executed in the reverse order, depending upon the functionality involved.

The description of the different illustrative embodiments has been presented for purposes of illustration and description and is not intended to be exhaustive or to limit the embodiments in the form disclosed. Many modifications and variations will be apparent to those of ordinary skill in the art. Further, different illustrative embodiments may provide different benefits as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for scanning a number of frequencies in a test environment, comprising:

suspending, using a plurality of lines, a transmitter and a receiver together within a scanning space bounded by walls, a ceiling, and a floor all composed of an insulation material configured to reduce reflection of signals from the transmitter within the scanning space, wherein the plurality of lines are connected to a plurality of motors configured to move corresponding ones of the plurality of lines, and wherein the plurality of motors are located at edges of the scanning space;

moving, using at least one of the plurality of motors, the transmitter and the receiver together to a number of locations in the scanning space;

transmitting, towards a reflector within the scanning space, signals at the number of frequencies from the transmitter at the number of locations and receiving reflected signals by the receiver at the number of locations, wherein the reflected signals are reflections of the signals transmitted at the number of frequencies from the transmitter; and identifying the number of locations in the scanning space.

2. The method of claim 1 further comprising matching frequency data derived from the reflected signals with location data identifying the number of locations to identify frequency characteristics of the scanning space.

3. The method of claim 1, wherein transmitting signals at the number of frequencies comprises transmitting signals at the number of frequencies from the transmitter at the reflector in the scanning space and receiving reflected signals comprises receiving reflected signals that are reflected from the reflector.

4. The method of claim 1, further comprising:
moving, using the motors, the transmitter and the reflector to another location within the scanning space, and then again transmitting signals towards the reflector.

5. The method of claim 4, wherein the plurality of lines are made of a material that is substantially non-absorbing and substantially non-reflective of the signals at the number of frequencies.

6. The method of claim 4, wherein the plurality of lines are made of a material selected from a group of materials consisting of nylon and Teflon.

7. The method of claim 1, wherein moving the transmitter and the receiver comprises moving the transmitter and the receiver in a plurality of directions to a plurality of locations in a two-dimensional plane in the scanning space.

8. The method of claim 1, wherein identifying the number of locations in the scanning space comprises optically identifying locations of the transmitter and the receiver.

9. The method of claim 8, wherein identifying the number of locations in the scanning space comprises optically identifying a location of a tracking marker that is moved along with the transmitter and the receiver when the transmitter and the receiver are moved in the scanning space.

10. The method of claim 8, wherein identifying the number of locations in the scanning space comprises identifying the locations of the transmitter and the receiver by a tracking system selected from a group of tracking systems consisting of a laser tracker and an electronic theodolite.

11. An system comprising:
a plurality of lines suspending a transmitter and a receiver together within a scanning space bounded by walls, a ceiling, and a floor all composed of an insulation material configured to reduce reflection of signals from the transmitter within the scanning space, wherein the plurality of lines are connected to a plurality of motors configured to move corresponding ones of the plurality of lines, and wherein the plurality of motors are located at edges of the scanning space, wherein the transmitter is configured to transmit signals at a number of frequencies from a number of locations in the scanning space wherein the receiver is configured to receive reflected signals at the number of locations in the scanning space, wherein the reflected signals are reflections of the signals transmitted at the number of frequencies by the transmitter and wherein the transmitter and the receiver are configured to be moved together to the number of locations in the scanning space; and
a tracking system configured to identify the number of locations in the scanning space.

12. The system of claim 11 further comprising a data recorder configured to record location data identifying the number of locations and corresponding frequency data derived from the reflected signals received at the number of locations.

13. The system of claim 11 further comprising a reflector in the scanning space, wherein the transmitter is configured to transmit signals at the number of frequencies at the reflector and the receiver is configured to receive reflected signals that are reflected from the reflector.

14. The system of claim 11, wherein the plurality of lines is made of a material that is substantially non-absorbing and substantially non-reflective of the signals at the number of frequencies.

15. The system of claim 11, wherein the plurality of lines is made of a material selected from a group of materials consisting of nylon and Teflon.

16. The system of claim 11, wherein the plurality of lines are configured to move the transmitter and the receiver together in a plurality of directions to a plurality of locations in a two-dimensional plane in the scanning space.

17. The system of claim 11, wherein the tracking system is configured to optically identify the locations of the transmitter and the receiver in the scanning space.

18. A method for scanning a number of frequencies in a test environment comprising:
supporting a transmitter and a receiver at a location in a scanning space by a number of lines, wherein the number of lines is made of a material that is substantially non-absorbing and substantially non-reflective of signals at the number of frequencies, wherein the number of lines are connected to a corresponding number of motors at edges of the scanning space, and wherein the scanning space is bounded by walls, a ceiling, and a floor all composed of an insulation material configured to reduce reflection of signals from the transmitter within the scanning space; and
moving, using the number of motors, the transmitter and the receiver together within the scanning space;
transmitting the signals at the number of frequencies from the transmitter at the location and receiving reflected signals by the receiver at the location, wherein the reflected signals are reflections of the signals transmitted at the number of frequencies from the transmitter.

19. The method of claim 18, wherein the number of lines is made of a material selected from a group of materials consisting of nylon and Teflon.

* * * * *